United States Patent [19]

Wisner

[11] 4,384,230

[45] May 17, 1983

[54] DIGITAL PIEZOELECTRIC ACTUATOR

[75] Inventor: George R. Wisner, Deep River, Conn.

[73] Assignee: United Technologies Corporation, Hartford, Conn.

[21] Appl. No.: 204,727

[22] Filed: Nov. 6, 1980

[51] Int. Cl.³ .......................................... H01L 41/00
[52] U.S. Cl. .................................... 310/317; 310/328
[58] Field of Search .......................... 310/26, 316–317, 310/328–332, 358, 363–364; 318/118, 135

[56] References Cited

U.S. PATENT DOCUMENTS

3,315,103  4/1967  Duff et al. ....................... 310/317 X
3,551,764  12/1970  Evans .............................. 310/317 X
3,649,856  3/1972  O'Neill ............................ 310/317 X
3,947,708  3/1976  Fulenwider ...................... 310/317 X

Primary Examiner—William M. Shoop
Assistant Examiner—Peter S. Wong
Attorney, Agent, or Firm—Dominic J. Chiantera

[57] ABSTRACT

A linear extension piezoelectric actuator comprises a displacement generator having a plurality of discrete groups of piezoelectric material segments disposed coaxially along the extension axis of the actuator, each group being energized separately by voltage excitation signals from an external source to provide a corresponding one of a plurality of extension increments which in summation provide the total range of extension along the extension axis.

10 Claims, 11 Drawing Figures

DIGITAL PIEZOELECTRIC ACTUATOR

TECHNICAL FIELD

This invention relates to linear stroke actuators, and more particularly to linear stroke peizoelectric actuators.

BACKGROUND ART

Analog linear stroke piezoelectric actuators are well known in the art. They provide a linear stroke, at a force determined by the "stiffness coefficient" of the actuator over a selected range of extension, in response to a voltage excitation signal applied to the piezoelectric material. The piezoelectric material, referred to as the actuator's "displacement generator", is typically a stack of piezoelectric wafers; the polarization axis of each wafer is aligned along the longitudinal axis of the stack to define the actuator's axis of extension. In the absence of a load, the stack is maintained in compression within the actuator housing by a "pre-load" force with a value selected to linearize the stiffness coefficient (Ks) of the displacement generator stack. This allows the actuator extension (D) to be defined in terms of the displacement force (F) by Hooke's law: $F = K_S \cdot D$. In operation, the piezoelectric elements are energized by a voltage excitation signal applied simultaneously to the entire stack, inducing an electric field intensity in each wafer. The wafers respond together by extending or contracting in dependence on the polarity of the induced electric field, by an amount proportional to the electric field intensity. By modulating the voltage signal magnitude to vary the electric field intensity, the amount of extension or contraction (retraction) may be controlled.

The piezoelectric actuators provide only small extension range values; less than 0.1% of their length. Their principal utility lies in the precision control of the extension. The incremental value of extension or contraction may be accurately correlated to a corresponding incremental change in the voltage excitation signal. Their drawback, however, is the inability to precisely define an absolute displacement value in terms of an absolute excitation signal magnitude due to the inherent hysteresis characteristic of the piezoelectric material. The hysteresis affects the repeatability of the actuator's mechanical displacement, so as to produce a steady state position (extension) error with respect to the applied excitation voltage signal magnitude. In AC applications this produces a phase lag at the fundamental drive frequency of the excitation signal.

While the actuator control circuitry may account for the position error to some extent, it is limited. The hysteresis decreases with decreasing extention increments, i.e. decreasing excitation signal magnitude, but in a nonlinear manner. This nonlinearity further affects the actuator responsivity; the extension increment value per voltage increment value. The presence of the hysteresis characteristic, compounded by its nonlinear change with decreasing excitation signal magnitude produces inaccuracies in the extension set point values which cannot be fully compensated.

DISCLOSURE OF INVENTION

The object of the present invention is to provide a linear extension piezoelectric actuator whose positional accuracy over a total range of extension, is unaffected by the hysteresis characteristic of the piezoelectric material.

According to the present invention, a linear extension piezoelectric actuator comprises a displacement generator having a plurality of discrete groups of piezoelectric material segments disposed coaxially along the extension axis of the actuator, each group being energized separately by voltage excitation signals from an external source to provide a corresponding one of a plurality of extension increments which in summation provide the total range of extension along the extension axis, whereby the actual extension value of the actuator along the extension axis is uniquely defined by the group excitation signals at steady state positions between increments. In further accord with the present invention, each group of piezoelectric segments is separately energized in a bistable manner by voltage signal magnitudes corresponding, alternately, to a quiescent state and to an extended state of each group, the steady state positions between increments being defined by the quiescent state and extended state voltage signal magnitudes presented to the groups.

According to one aspect of the present invention, each group comprises equal numbers of piezoelectric segments, and each group receives equal magnitude quiescent state and extended state voltage signals for providing equal value extension increments, whereby the actual extension value of the actuator along the extension axis is equal to the lineal sum of the group extension increments as represented by the number of present extended state voltage signals.

According to another aspect of the present invention, the numbers of piezoelectric segments and the magnitude of the quiescent state and extended state excitation signals for each group are selected so that each group provides an extension increment value which is a binary multiple of that provided by each other group, each group being associated with a related bit of a binary excitation signal having multiple bits ranging from a least significant bit to a most significant bit, the quiescent state and extended state of each group corresponding to the bistable states of the associated bit, whereby the actual extension of the actuator is provided in a binary progression in response to the binary excitation signal.

In further accord with both aspects, each segment in each group comprises a pair of piezoelectric wafer elements, each wafer having parallel, high potential and low potential surfaces defined in respect to the axis of polarization, the wafers in each segment being disposed coaxially with their high potential surfaces bonded to either side of a central high potential electrode and their low potential surfaces each bonded to a mating side of an associated low potential electrode, successive segments being joined with immediately preceding and succeeding segments at the low potential electrode, to provide a tandem cascade of oppositely polarized wafers interleaved with alternating high potential and low potential electrodes along the axis of extension. In still further accord with the present invention, the actuator includes a housing for encasing the groups of piezoelectric segments, and a pre-load force means for maintaining a compressive load along the longitudinal axis of the displacement generator to provide a linear stiffness coefficient of displacement force per increment of extension along the total range of extension of the actuator.

The linear stroke piezoelectric actuator of the present invention provides a linear stroke extension which is the summation of a plurality of successive, individual extension increments, each having a minimum value equal to the minimum resolution increment selected for the actuator. The steady state intervals between increments are repeatable, independent of the hysteresis characteristic associated with the piezoelectric material. The actuator may be provided in either a linear weighted mode in which each group of segments is energized in a linear succession, or alternatively in a binary weighted mode in which the piezoelectric segments are energized in a binary progression corresponding to excitation of a least significant bit through to a most significant bit. In either mode the actual value of extension is independent of the effects of the material hysteresis.

These and other objects, features, and advantages of the present invention will become more apparent in light of the following detailed description of a best mode embodiment thereof, as illustrated in the accompanying drawing.

BEST MODE FOR CARRYING OUT THE INVENTION

Figure 1A:
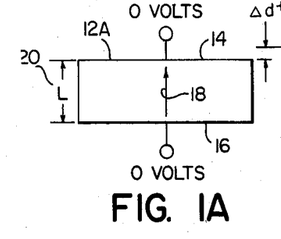
FIGS. 1A–1C are simplified illustrations of the transducing characteristic of piezoelectric material used in the pesent invention.
Figures 1B, 1C:
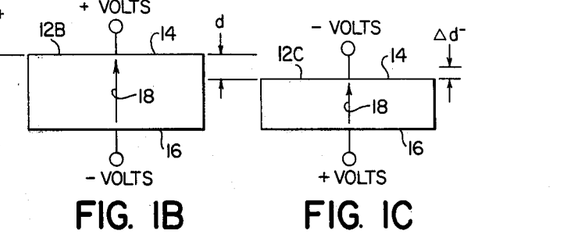

FIGS. 1A through 1C illustrate the fundamental piezoelectric characteristic of transducing electrical energy into mechanical energy. In FIG. 1A a piezoelectric substrate 12A includes major surfaces 14, 16 which are orthogonal to the axis of polarization ($d_{33}$) 18 of the substrate, and which are spaced apart at a distance (L) 20 in the absence of an applied electric field. The substrate is in its quiescent state. In FIG. 1B an applied positive electric field (positive with respect to the gradient of $d_{33}$) causes the substrate to extend 12B by an increment $\Delta d^+$ to an extended state, with the major surfaces spaced a distance $L+\Delta d^+$. Similarly, an applied negative polarity electric field results in contraction of the substrate (12C, FIG. 1C) by an amount $\Delta d^-$, spacing the surfaces at a distance $L-\Delta d^-$. The total degree of extension (change in spacing of the two major surfaces) between the contracted state and the extended state is equal to $d = |\Delta d^+| + |\Delta d^-|$.

Figure 2:
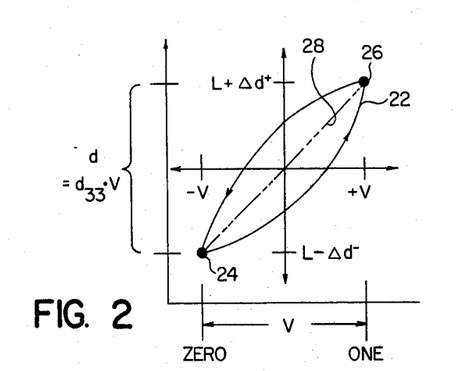
FIG. 2 is a graphical illustration of the extension characteristic of the piezoelectric material illustrated in FIG. 1.

In FIG. 2 the waveform 22 illustrates a typical hysteresis characteristic for the piezoelectric material during the transducing cycle. The waveform (slightly exaggerated for purposes of illustration) defines the instantaneous value of extension (d) of the substrate in response to the instantaneous magnitude of the applied excitation voltage (V). As shown, due top hysteresis a given value V defines two values of extension; the actual value depends on the direction of excursion. It is this characteristic which provides the position inaccuracies of the prior art analog actuators.

The magnitude of the increment d in FIG. 2 is measured between the steady state intervals, or end points 24, 26, each of which are steady state extension values uniquely corresponding to a particular excitation voltage magnitude. They are repeatable values. By applying the excitation voltage in discrete magnitudes (labeled ZERO, ONE in FIG. 2), each corresponding to that required to provide the associated steady state extension value, the substrate is extended at an average gain ($\Delta d/\Delta V$) 28 by a known increment d, unaffected by hysteresis. This is the principle on which the piezoelectric actuator of the present invention is based, namely the bistable operation of the piezoelectric material to produce discrete changes, or increments of extension over the full range of actuator travel.

Figure 3:
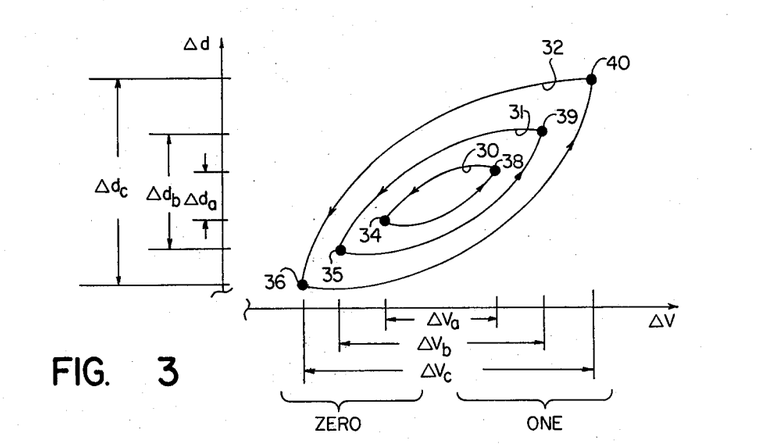
FIG. 3 is a graphical illustration of another piezoelectric material characteristic, which is used in the description of the present invention.

FIG. 3 illustrates the response of the piezoelectric material to modulation of the excitation signal magnitude. The hysteresis curves 30–32 define the relationship between the excitation voltage increments $\Delta V_a$, $\Delta V_b$, $\Delta V_c$ and the resulting extension values $\Delta d_a$, $\Delta d_b$, $\Delta d_c$, each having the quiescent state (34–36) and extended state (38–40) steady state values shown. The steady state values of each increment are fixed in relation to the applied excitation voltage magnitude. FIG. 3 illustrates that the extension may be a subrange value of the maximum extension, so that the total range of extension may be quantified into a plurality of equal extension increments. This may be provided with a number of substrates, or discrete groups of piezoelectric segments arranged in a cascaded stack, such that the incremental extension provided by each is additive to provide the total. The relative value of the increment to the total range is selectable and generally based on the minimum resolution accuracy required for the actuator. As such, the actuator slews from minimum to maximum extension in discrete steps, each corresponding to an incremental value.

Figure 4:
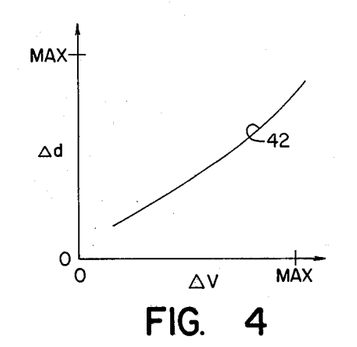
FIG. 4 is an alternate graphical illustration of the characteristic illustrated in FIG. 3.

The waveforms 30–32 of FIG. 3 also illustrate the nonlinearity of the gain ($k=\Delta d/\Delta E$, phantom line 28 of FIG. 2) with different extension increment values. Each hysteresis curve has a different extension gain value; a lower gain at the lower excitation signal magnitudes, and increasing in a nonlinear manner as the magnitude increases. This relationship is illustrated by the gain curve 42 of FIG. 4. This nonlinear characteristic exists in, and contributes to, the errors in the prior art analog type actuators. Its importance to the present invention lies only in the fact that it may be desirable to change the magnitude of the applied excitation voltage signal for one or more of the piezoelectric segments to ensure a particular increment value. This ability to change the magnitude of the electric field intensity together with the numbers of piezoelectric segments of each group used in the actuator provides an added dimension in controlling the final actuator configuration to achieve optimum accuracy.

The quantizing of the total extension range into increments requires that the group segments be energized individually. This is the point of departure of the present invention from the piezoelectric actuators of the prior art. Each of the groups of segments are mechanically arranged in tandem so that their individual extension increments are cumulative. Only the end point values in each increment are controlling and they are precisely defined with respect to the magnitude of the voltage excitation signal. If only extension of the segments is desired i.e. no contraction, the magnitude of the voltage excitation signal corresponding to the quiescent state end point value is zero volts. This further simplifies the requirements in maintaining high positional accuracy of the acuator over its total stroke range.

Figure 5:
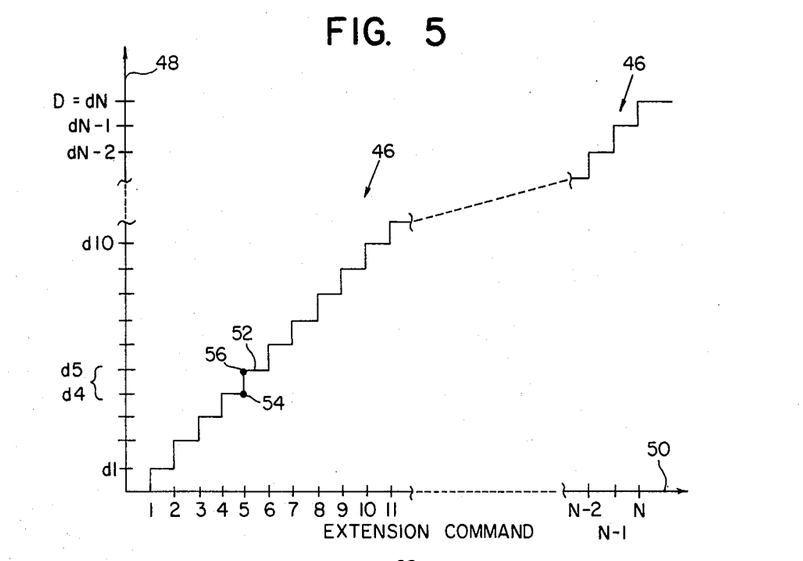
FIG. 5 is an illustration of an operating characteristic of a linear stroke, piezoelectric actuator according to the present invention.

In FIG. 5, the discontinuous function 46 illustrates the steps resulting from quantizing the total range of extension into extension increments (the ordinate 48) where $D=d_N$; each extension increment corresponds to a related one of a number of sub-intervals (abscissa 50) of an Extension Command signal presented to the actuator. Only the steady state intervals between steps, i.e. the end points of each step, are controlling with regard to a position. As such, the step 52 (corresponding to the Extension Command signal interval number (5)) increases the instantaneous extension value $(D+=\Sigma d_1+d_2+d_3+d_4)$ by the increment $d_5$, having a quiescent state 54 corresponding to the $d_4$ extended state, and having an extended state 56. The end points 54, 56 are repeatable with respect to Extension Command signal input and the effects of material hysteresis on positional accuracy are invisible.

The piezoelectric segments of each group may include more than one piezoelectric element, and while each group of segments are energized individually the individual segments of each group and their elements are energized simultaneously by the same excitation signal. As such, the extension of each segment and the elements of the segment occurs simultaneously and contributes to the total increment extension value of the particular group of segments. The practicality of using multiple elements per segment stems from the difficulty associated with gaining electrical access to individual elements, mechanically arranged in tandem in a stack. Although each element may be provided with its own electrodes and then electrically insulated from adjacent elements in the stack, this arrangement is both costly and inefficient since the increased length of the stack resulting from the addition of the insulators decreases the stiffness coefficient, ($K_s$) of the actuator's displacement generator. A more practical solution is to use two elements, or wafers per segment; mounted together coaxially with mutual opposition of the axis of polarization of each so that each share a common high potential electrode with each other and share a common low potential electrode with the immediately preceding and immediately succeeding segments in the stack.

Figure 6:
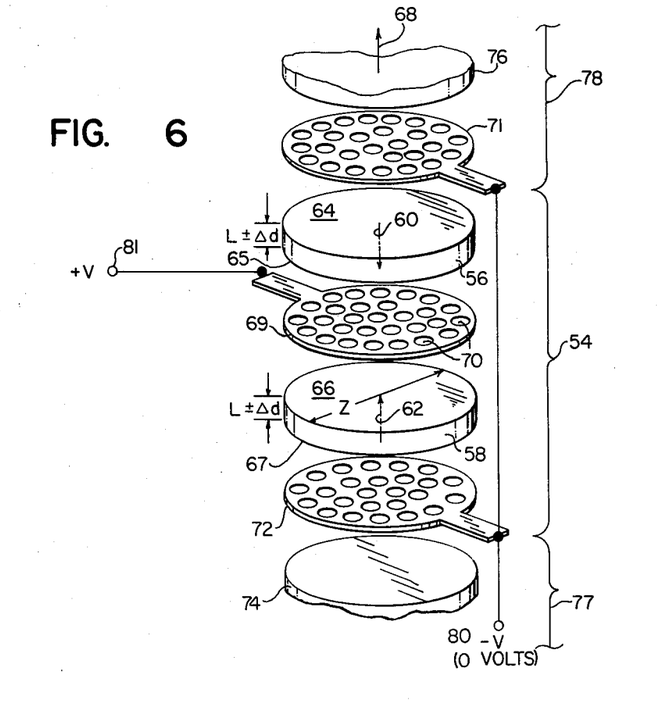
FIG. 6 is an exploded, perspective view of one portion of the piezoelectric actuator of the present invention.

FIG. 6 is an exploded, perspective illustration of the best mode segment embodiment. The segment 54 includes two piezoelectric material wafers 56, 58 each having polarization axis 60, 62 and major surfaces 64, 65 and 66, 67 respectively. The major surfaces are orthogonal to the axis of polarization; the major surfaces associated with the positive direction of the polarization axis is termed the high potential surface (surfaces 65, 66) and that opposite the direction of polarization being termed the low potential surface (64, 67). The two wafers are coaxial with the actuator's extension axis 68 with their individual polarization axes being mutually opposed so that the high potential surface of each wafer faces one another. The wafers are bonded along their high potential surfaces to either side of a high potential electrode 69. The electrode is a conductive metal alloy, typically berylium-copper, with a cross-sectional geometry equal to that of the wafers. The electrode is bonded in registration to each wafer surface with an electrically conductive epoxy; holes 70 through the electrode allow flow through of the epoxy to ensure a high strength bond. The low potential surfaces (64, 67) of each wafer are bonded with conductive epoxy to one side of a related one of two low potential electrodes 71, 72, each identical to the electrode 69. The opposite side of each low potential electrode is similarly bonded to the low potential surfaces of wafers 74, 76 (only partially illustrated) associated with an immediately preceding segment 77 and an immediately succeeding segment 78 (as referenced to the direction of the axis of extension 68).

As known, although the extension of the piezoelectric material is proportional to the magnitude of the applied excitation voltage it is independent of the dimension of the material in the direction of extension, i.e. the thickness of the wafers 56, 58 in FIG. 6. Therefore, it is desirable to provide the wafer elements with as small a dimensional thickness as possible to limit the required magnitude of the excitation signal and to provide a compact, tandem stack of elements. The minimum thickness is limited by nonperformance standards including manufacturing tolerances and the mechanical strength of the wafer; the thinner the wafer the more likely it may shatter during assembly. A typical wafer thickness is on the order of 0.03 inches ($762 \times 10^{-6}$M). For piezoelectric material such as lead zirconate titanate, or barium titanate, the maximum electric field intensity is on the order of fifty kilovolts per inch of material thickness, such that for the 0.03 inch thick wafer the maximum electric field intensity is 1500 volts per $IN^2$ (591 volts/$cm^2$).

As illustrated in FIG. 6 the low potential electrodes 71, 72, which are commonly shared by adjacent segments, are connected in series to the output of a low potential source 80, and the high potential electrode 69 is connected to the output of a high potential source 81. The low potential source may either be a negative voltage source or, if only a positive voltage excitation signal is to be used, it may be signal ground. Similarly, the positive voltage source 81 may be either a positive voltage source or, alternatively, signal ground for use with a negative voltage source 80. As described hereinbefore with respect to FIGS. 1A-1B, the piezoelectric material may be energized with an excitation voltage of either polarity to create an electric field intensity in either direction, i.e. positive or negative polarity with respect to the direction of polarization. However, a negative electric field intensity may result in reverse polarization of the wafer if permitted for any extended time. Therefore, any negative electric field intensity is limited to a fraction of the maximum value magnitude, typically one-third. A preferred manner of energizing the wafers is to use a single polarity, positive excitation source connected at 82 with the connection 80 tied to signal ground. In this mode of operation the segment wafers are de-energized in the quiescent state as opposed to being in a state of contraction.

Figure 7:
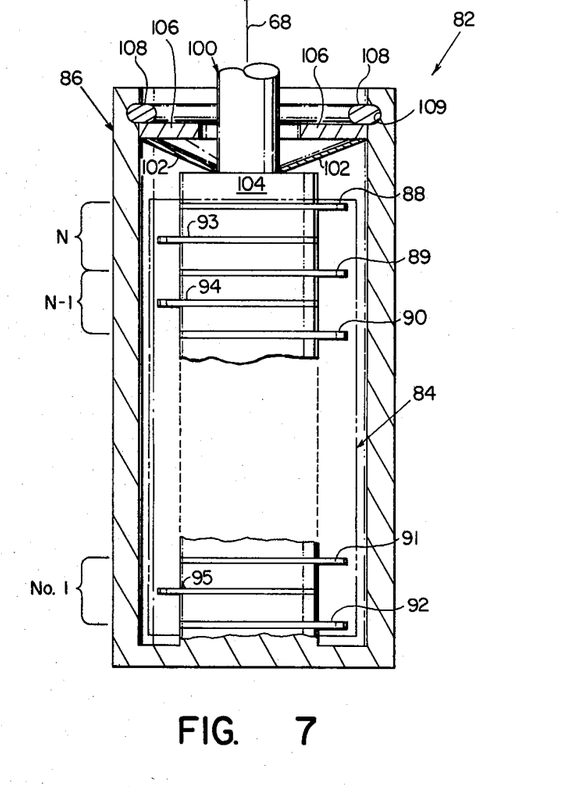
FIG. 7 is a simplified, partial cross section elevation of a linear piezoelectric actuator according to the present invention.

FIG. 7 is a simplified partial cross section of the actuator 82. The bonding of each segment to each adjacent segment forms a unitary, stack assembly which comprises the actuator's displacement generator 84. The stack of segments (No. 1 through N) of the generator are enclosed in an actuator housing 86. The segments may be separated into discrete groups (described hereinafter) and each include low potential electrodes 88-92 and high potential electrodes 93-95, with adjacent segments sharing common low potential electrodes, e.g. segments N and N-1 share the common low potential electrode 89, etc. The stack is maintained in position within the housing by a plunger assembly 100 which transmits a compressive "pre-load" force generated by a belleville washer 102 (downwardly in FIG. 7) on the stack. The belleville washer is positioned in contact with a flange 104 of the plunger and maintained in position by a flat washer 106 which is secured by a spring loaded locking washer 108 fitted within a circumferential slot 109 along the inside wall of the output end of the housing. The compressive force on the piezoelectric segments is of sufficient magnitude to linearize the stiffness coefficient ($K_S$) of the stack to provide a linear force versus displacement relationship ($F = K_S \cdot \Delta d$) over the total range of extension of the actuator.

The mechanical housing (packaging) configuration of FIG. 7 is only typical, and is similar to the mechanical housings of the prior art analog type actuators. Any one of a number of housing configurations which maintain the desired pre-load, and transmit the output force of the displacement generator to the load, may be used. The plunger 100 provides the output manifestation of extension of the actuator. The actual means for coupling the plunger to the particular load whose displacement is to be controlled varies with the type of load i.e. is application limited, and forms no part of the present invention.

The total number (N) of piezoelectric segments required in a given application is determined by: (1) the required range of extension (D), (2) the mechanical transducing gain (units of length of extension per unit of excitation voltage magnitude, or $d_{33}$) of the piezoelectric material, and (3) the geometry (thickness and cross-sectional area) of the segment wafer elements. Appendix A illustrates the calculation of the number of wafers (M) required in a particular design example, using an analysis model based on the "parallel spring combinations". The actuator is represented by an ideal motion generator $\delta_S$ in series with an ideal spring having a stiffness coefficient $K_S$. The load and pre-load forces are represented by springs with stiffness coefficients $K_M$ and $K_P$ respectively. The equivalent stiffness coefficient of the load and pre-load in parallel is the sum of the two ($K_M + K_P$). The gain of the ideal motion generator to the load, i.e. the realized extension value (D) of the actuator in the presence of the load $K_M + K_P$, is equal to the ratio of the actuator stiffness coefficient $K_S$ to the sum of all the coefficients, as shown in equation (1).

The calculation of Appendix A is based on the assumed specifications tabulated, where: Y is Young's Modulus for the material, L is the thickness of the piezoelectric wafers, A is the cross-sectional area of the wafers, $d_{33}$ is the transducing gain along the axis of polarization, and D is the required realized extension value. Assuming a gain of 0.5 in equation (1), such that $K_S = K_M + K_P$ (equation (2)), then the required displacement generator output extension is determined from equation (3). Since the displacement generator extension is the sum of the extension increments of the N segment stack of M number of wafers (equation (4)), for an excitation voltage signal magnitude $V_S = 1.0$ KV the total number of wafers $M = 100$. For the embodiment of FIG. 6 this equals 50 segments (equation (6)). The total length (X) of the 100 wafer stack is approximately three inches (equation (7)), and equation (8) defines the value of the actuator stiffness coefficient $K_S$ in terms of the wafer cross-sectional area (A), the total stack length (X), and the value of Young's Modulus for the material. For the values assumed $K_S = 333 \times 10^3$ Lb/IN ($583.4 \times 10^8$ dynes/cm) or 110% of that originally assumed, such that the actual realized extension ($D_A$) is 110% of the required value (equations (9), (10)).

As stated before, the segments of the displacement generator are separated into discrete groups, each of which may include one or more segments. The separation is marked by the separate excitation voltage signals applied to the groups notwithstanding the physical arrangement of all the segments in the stack. The separation of the excitation signals is made possible by the segment embodiment of FIG. 6 where adjacent segments share low potential electrodes, but the high potential electrodes are isolated to each segment alone. As such, the bistable operation of the actuator may be controlled in a number of different excitation modes, of control formats. Two of these include a "linear weighting" format and a digital, or "binary weighting" format. In the linear format each group includes an equal number of piezoelectric segments, each group of segments being energized individually, one at a time. Each provides, in response to the individually applied excitation signals, equal extension increment values. In other words the energizing of the group segments occurs in a linear succession, such that the instantaneous value of actuator extension is the lineal summation or accumulation of each of the extension increments provided to that time.

Figure 8:
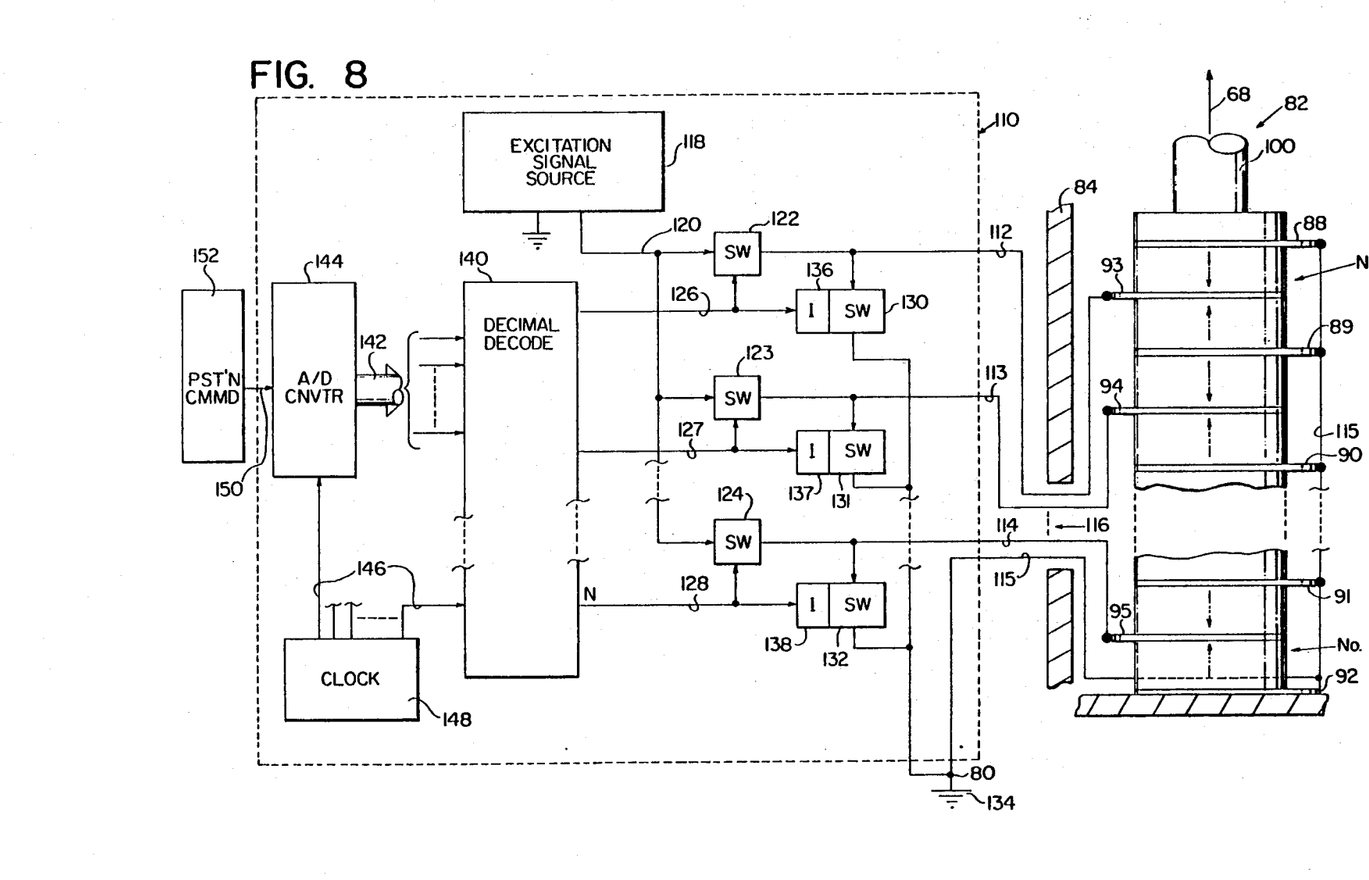
FIG. 8 is a simplified, system block diagram illustration of a linear weighted control mode embodiment for the piezoelectric actuator of FIG. 7.

FIG. 8 is a simplified block diagram illustration of one embodiment of a linear control system 110 for the actuator 82 of FIG. 7. In FIG. 8 it is assumed that each group includes only one segment, i.e. N segments equals N groups. In the linear control format the high potential electrodes 93-95 of each segment (group) are connected individually through lines 112-114 to the control system 110; the low potential electrodes 88-92 are connected in common through a line 115 to the control system. All of the lines are coupled out of the actuator through a suitable exit aperture 116 formed in the wall of the housing 84. In the control system a common voltage source 118 provides voltage excitation signals $V_S$ on an output line 120 to the inputs of a plurality of voltage controlled switches 122-124, each associated with a corresponding one of the high potential lines 112-114. The switches are of a type known in the art, such as thyristors, or SCR's with gate and forward voltage ratings selected in dependence on the voltage signal and current signal magnitudes required with the particular number of segments of the actuator. In FIG. 8 it is assumed that the switches shown include the appropriate commutation circuitry required to swtich off the SCR's, all of which is well known in the art. The switches are controlled by gate voltage signals provided on lines 126-128, and when conductive in the presence of a gate signal they present the voltage excitation signal from the line 120 to the associated one of the lines 112-114.

Since the piezoelectric segments are charge devices, electrically equivalent to a capacitor, once energized they must be de-energized in order to return to the quiescent state, i.e. to retract. This discharging is provided by voltage controlled switches 130-132, similar to the switches 122-124, each connected to a related one of the high potential lines 112-114. The outputs of each of these switches are connected in common to the low potential line 115 and in turn to the low potential source 80 (FIG. 7), which in the embodiment of FIG. 8 is selected as signal ground 134, or zero volts. The switches 130-132 each receive the gate signals provided on the lines 126-128 through an associated one of a plurality of INVERT gates 136-138. As such, the discharge switches are de-energized (nonconducting) in the presence of the energizing (conductive state) of the associated one of the switches 122-124 connected to the common high potential line.

The gate signals on the lines 126-128 are provided by a decimal decoder 140 of a type known in the art. The decoder provides the signals as a N number of mutually exclusive output gates corresponding to the instant binary state of a digital signal presented on lines 142 to the decode from an analog-to-digital (A-D) converter 144. Both the decode 140 and A/D 144 receive common time base signals on lines 146 from a control system clock 148. The binary signal on the lines 142 represent the equivalent digital signal magnitude of the instantaneous value of the Extension Command signal (FIG. 5) provided on an input line 150 to the A/D from an Extension Command signal generator 152.

In operation, the linear control system 110 receives the Extension Command signal on the line 150 and converts it into a multiple bit equivalent digital signal. The number of bits required is dependent on the number (N) of actuator segments to be energized. The decoder 140 provides the output gates which are strobed to the lines 126-128 by the time base signals from the clock 148. The switches 122-124 are sequentially energized in response to the gate signals which are provided, in turn, in dependence on the magnitutude of the Extension Command signal. When energized, each switch connects the source (118) output between the related high potential electrode and signal ground; energizing the particular actuator segment to provide the extension increment. The switches 130-132 respond to the absence of a gate signal on the related gate line to provide a discharge path to the related segment, de-energizing the segment and causing it to return to its quiescent state. The segments are energized in succession beginning with the first segment for the first increment to segment N whose response, when added to the prior energized segments, provides the maximum extension of the actuator (FIG. 5).

In FIG. 8 the Extension Command signal generator 152 is intended to represent a generic signal source, i.e. any of the possible sources of Position Command, such as an open loop command signal to the control 110, whereby the actuator 82 provides open loop positioning of the selected controlled device, or as the error signal at the output of the summing junction of a closed loop system, representing the difference magnitude between a position command and the feedback signal provided from the controlled device. As such, the Extension Command signal source itself forms no part of the present invention. Similarly, the control system 110 itself represents only one, simplified embodiment of a control system for providing linear control of the actuator. Any one of numerous alternative embodiments as may be obvious to those skilled in the art may be used.

The binary weighing control format divides the segments of the displacement generator into signal bit groups, each group representing one bit of a digital binary word defining the Extension Command signal value. With the binary control format the group segments are themselves identical to those used for the linear weighting control, i.e. the assembly of FIG. 6. The distinction, however, is that the N number of segments are divided in a binary manner among the bit groups, beginning with a single segment least significant bit (LSB) through to a plural segment most significant bit (MSB); the segments in each group are energized simultaneously, and the extension increment of each group is a binary multiple of each other group. The advantages to the binary weighting format is that the actuator may interface directly with a digital system, and there are less switches by the control system since the groups are energized in a binary rather than a linear progression.

The number of segments assigned each bit is defined by the binary weight of the particular bit. In a simple four bit actuator which quantizes the total extension range of the actuator into 15 discrete states, the number of segments from LSB to MSB follows the binary sequence: one, two, four, and eight; only four switches are required. The disadvantage, however, is that the switching rate, or frequency is much higher than in the linear control mode for all bits other than the MSB. Over the full cycle of extension (min to max and back to min) the LSB segment in the four bit case must be switched 16 times whereas the MSB is switched only twice. Since the piezoelectric material is capacitive this requires charge transfer for the LSB every one-eighth of the range of extension. The frequency of the LSB must increase as the number of bits associated with the actuator increases, such that the actual number of bits used may be limited by the required switching frequency of the LSB, i.e. the ability to transfer the charge to and from the segments within the time period associated with the switching frequency of the LSB.

The binary weighting of the actuator based purely on assigning binary numbers of segments to each group may conflict with the total displacement and minimum resolution accuracy requirements, both of which depend on the value of the incremental extension provided by each group of segments. An eight bit actuator which is binary weighted purely by assigning binary numbers of segments to each group, results in 255 segments, or an excess of 205 segments for the design example of Appendix A. Binary weighting, however, only requires that each group provide extension increments which are binary multiples, i.e. the next least significant bit provides twice the extension of the LSB and so on in a binary progression. Each group need not itself comprise a binary number of segments. Since, as described with respect to FIG. 3 the actual extension depends on the magnitude of the applied voltage, the magnitude of the excitation voltage may also be scaled. As such, the binary weighting may be provided as a combination of assigned numbers of segments to each bit together with the scaling, when necessary, of the excitation voltage signal magnitude provided to each segment bit group associated with a particular bit.

This is illustrated with respect to the 100 wafer design of Appendix A. The binary weighting of each group is based on bit duty cycle over the full range of extension.

Since the MSB has a 50% duty cycle it is assigned approximately one-half of the total number of wafers; approximately, because each subsequent lesser significant bit is a sub-multiple of two and there are two wafers per segment, such that it is desirable to select a number (approximately one-half the total) which results in the greatest number of even sub-multiples. For the 100 wafer Appendix A example the MSB is assigned 48 wafers. The second most significant bit is assigned 24, the third bit has 12 and so on. Table I tabulates the distribution of the wafers beginning with the MSB down to the LSB, or MSB-7 for the eight bit actuator. The 48 wafers are energized with a source voltage $V_S$, and since the wafer extension value (d) is equal to $d = d_{33} \cdot V_S$, the equivalent weighted extension value for the MSB is then equal to 48·d as shown in the last column of Table I.

TABLE I

| Bit Number | Binary Weight (%) | Assign'd Number of Wafers | Excitation Voltage | Equivalent Weighted Extension Value |
|---|---|---|---|---|
| MSB | 50 | 48 | $V_S$ | 48d |
| MSB-1 | 25 | 24 | $V_S$ | 24d |
| MSB-2 | 12.5 | 12 | $V_S$ | 12d |
| MSB-3 | 6.25 | 6 | $V_S$ | 6d |
| MSB-4 | 3.125 | (3)4 | $\frac{3}{4} \cdot V_S = V_{S1}$ | 3d |
| MSB-5 | 1.563 | 2 | $\frac{3}{4} \cdot V_S = V_{S1}$ | 1.5d |
| MSB-6 | 0.781 | (1)2 | $\frac{3}{8} \cdot V_S = V_{S2}$ | 0.75d |
| MSB-7 | 0.391 | (0.5)2 | $\frac{3}{16} \cdot V_S = V_{S3}$ | 0.375d |
| | | | | 95.625d |

The segment number binary progression continues through bit MSB−3, each bit excited by the full magnitude source excitation voltage $V_S$. For MSB−4 the binary progression results in three wafers, however, since there are only multiples of two wafers per segment a total of four wafers is provided and the magnitude of the voltage excitation signal is scaled by the ratio of the ideal binary value divided by the actual value, or $\frac{3}{4} \cdot V_S$. This produces the equivalent weighted extension value of 3·d. The next succeeding bit MSB−5 has one-half the wafers of MSB−4, or 2 wafers and the same scaled down excitation signal magnitude is used ($V_{S1}$) to provide an equivalent extension 1.5·d. The remaining two bits are voltage scaled since the normal binary progression would result in numbers of wafers less than the minimum associated with a segment. As such, the next to least significant bit (MSB−6) is energized with a scaled voltage $\frac{3}{8} \cdot V_S$ and the LSB with the scaled voltage $3/16 \cdot V_S$ ($V_{S2}$, $V_{S3}$).

The sum of the equivalent weights assigned to each of the bits through the combination of pure binary distribution and voltage scaling results in a total extension equivalent of 95.63·d. This is less than full range, however, since the caculation of the 100 wafers itself provided a 110% over range value, the equivalent extension of Table I is: $(95.63) \cdot 1.10 = 105.2d$.

Figure 9:
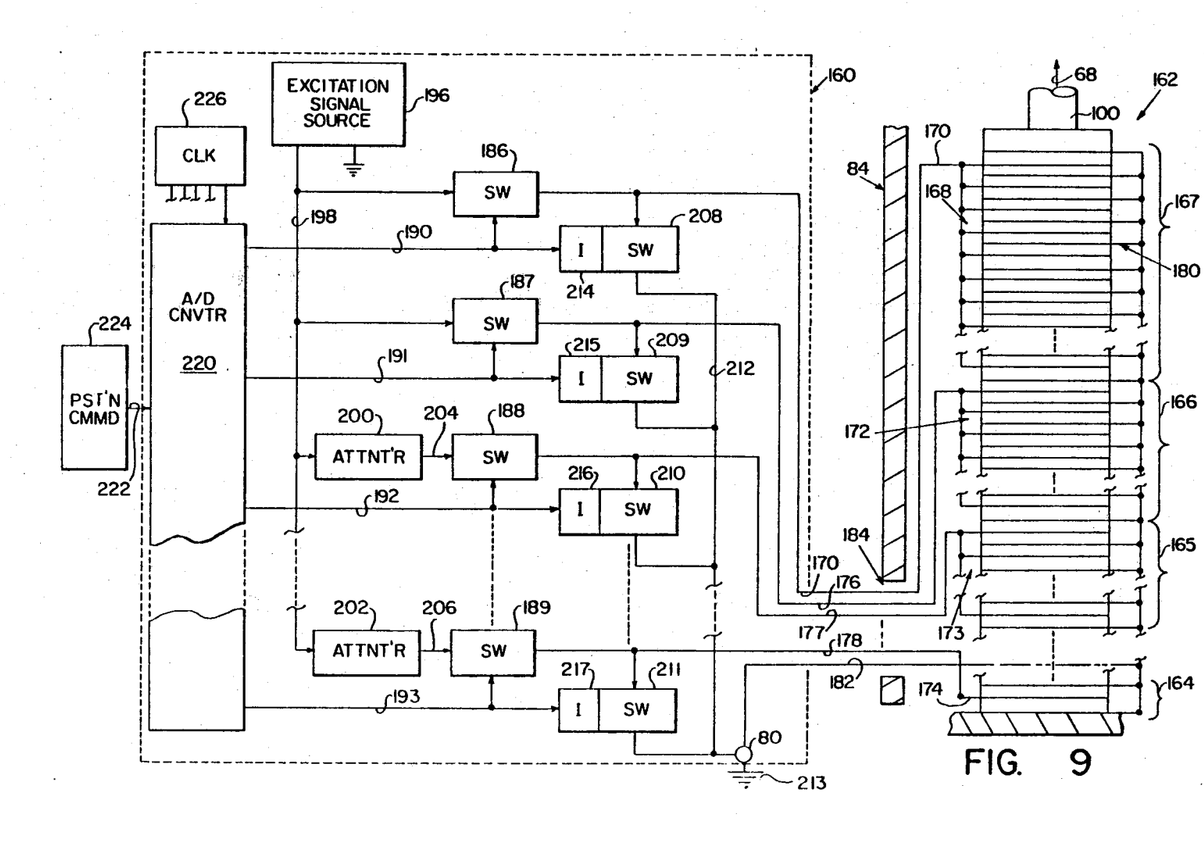
FIG. 9 is a simplified, system block diagram illustration of an alternative, binary weighted control mode embodiment for the actuator of FIG. 7.

FIG. 9 is a simplified, block diagram illustration of one embodiment of a binary format control unit 160 which may be used to control extension of a binary weighted actuator 162. The actuator 162 is identical to that of FIGS. 7, 8 with exception of the assignment of the numbers of segments to the groups 164–167, which correspond to the signal bits of a multiple bit word, beginning with the LSB (164) to the MSB (167). The segments are disposed along the axis of extension 68 in the same manner as that for the linear format actuator; the only physical distinction is the interconnection together of all of the high potential electrodes common to each bit group. All of the high potential electrodes 168 of the MSB group (167) are connected in common to the MSB high potential line 170. Similarly, the high potential electrodes 172–174 in groups 166–164 are connected in common to a related one of the high potential lines 176–178. The low potential electrodes 180 of all bit groups are tied in common to the low potential line 182. All lines are fed through an exit aperture 184 in the actuator housing 84 to the control unit 160.

In the control unit the high potential lines 170, and 176–178 are connected to one side of an associated one of a pluarality of voltage controlled switches 186–189. The switches are similar to those used in the linear control system, i.e. thyristors or SCR's which include the necessary commutation and which are conductive or nonconductive in response to the presence or absence of gate voltage signals on the lines 190–193. An excitation signal source 196 provides a voltage excitation signal at the maximum voltage magnitude $V_S$ selected for the particular actuator, typically 1.0 KV. The required bit group binary weights are provided with a combination of assigned numbers of segments and, when necessary, scaled values of $V_S$. As such, the output from the source 96 is presented to one or all of the switches 186–189 directly and through attenuation network to one or more others of the switches. In FIG. 9 $V_S$ is presented directly to switches 186, 187 related to the MSB and MBS−1 groups (167, 166), and through attenuation networks 200, 202 to switches 188, 189 related to the LSB+1 and LSB groups (165, 164). Each attenuation provides the required scaled value of $V_S$ (described hereinbefore with respect to Table I) or $V_{S1}$, $V_{S2}$ on lines 204, 206.

As in the linear control system, discharging of the piezoelectric segments is provided by discharge switches 208–211 which may be identical to the switches 186–180 (FIG. 8). Each are connected to a related one of the high potential lines 170, 176–178. With the linear control format the segments were energized individually such that all of the switches had a same voltage and current ratings, however, the grouping of a number of segments in each bit group results in different, higher capacitive loads and variations in the load current through each switch, i.e. in-rush current magnitude. As such, the energizing and discharging switches related to a common bit group have similar current and voltage ratings, which may differ from the other bit groups. The discharge switches 208–211 receive the gate signals on lines 190–193 through associated INVERT gates 214–217, so that the discharge switches are de-energized (nonconducting) in the presence of the energizing (conductive state) of the associated one of the energizing switches 186–189 connected to the common high potential line.

In FIG. 9 it is assumed that the input Extension Command signal is analog, requiring the use of an A/D converter 120 which receives the signal on an input line 122 from some type of Position, or Extension Command signal generator 124. The A/D under time base control of a clock 126 converts the analog signal magnitude into an equivalent multiple bit digital signal; one bit associated with each bit group of the actuator. In operation, the control unit receives the Extension Command signal and the A/D provides the equivalent multiple bit signal output on lines 190-193. The switches 186-189 respond to the signal bit gate signals on the associated gate line and when conductive present the voltage excitation signal to the high potential line of the associated bit group. Each energized bit group responds with all of the segments, simultaneously, to provide a group extension increment which is the lineal sum of the individual segment extension increments of that group. The sequence of energizing the bit groups follows the binary progression of the digital signal from the A/D.

As with the linear control system of FIG. 8, FIG. 9 represents only one embodiment of a binary control system which may be used to sequence a binary weighted actuator. Any one of a number of alternative embodiments, as may be obvious to those skilled in the art, may be used. Similarly, the embodiment of FIG. 9 may, in addition to the elements shown, require use of selected inductive loads to suppress switching transients or to limit peak values of charging and discharging currents, all of which is well known to those skilled in the art.

The linear stroke, piezoelectric actuator of the present invention overcomes the accuracy limitations of the prior art, analog type piezoelectric actuators resulting from the hysteresis characteristic of the piezoelectric material. In the present invention, the total range of extension of the actuator is quantized into a plurality of extension increments, each provided in discrete fashion by one of a plurality of groups of piezoelectric segments operatively energized in a bistable manner between a quiescent state and an extended state. The end point extension values i.e. the steady state intervals between extension increments, are uniquely defined in terms of Extension Command signal value.

The sequence of energizing the group segments to provide the extension increments may be provided in alternate control modes, including a linear control format and a binary control format. The relative advantage of one control format over the other may be determined on an applied use basis. Each of the piezoelectric segments may themselves comprise a single piezoelectric wafer, or element, however, a preferred embodiment segment comprises two wafers disposed so as to permit the energizing of each by a common high potential electrode and to permit each wafer to share a common low potential electrode with a wafer in an immediately preceding or immediately succeeding segment in the tandem stack.

Similarly, although the invention has been shown and described with respect to a best mode embodiment thereof, it should be understood by those skilled in the art that various other changes, omissions, and additions thereto, may be made therein without departing from the spirit and the scope of the invention.

APPENDIX A
Analysis Model

Where:
$K_M$ = Stiffness Coefficient of Load;
$K_P$ = Stiffness Coefficient of "Pre-Load";
$K_S$ = Stiffness Coefficient of Actuator Displacement Generator;
$\delta_S$ = Actuator, Ideal Displacement Generator; and $$D = \delta_S \cdot \frac{K_S}{K_S + K_M + K_P}, \text{ Realized Extension.} \quad (1)$$

Assume:
$Y = 2 \times 10^6$ Lb/IN$^2$ (0.14 $\times 10^{12}$ dynes/CM$^2$)
$A = 0.5$ IN$^2$ (3.23 CM$^2$)
$K_M = 265 \times 10^3$ Lb/IN$^2$ (464.3 $\times 10^8$ dynes/CM$^2$)
$K_P = 5 \times 10^3$ Lb/IN$^2$ (8.76 $\times 10^8$ dynes/CM$^2$)
$d_{33} = 40 \times 10^{-6}$ IN/KV (1.02 $\times 10^{-6}$ M/KV)
$L = 30 \times 10^{-3}$ IN (762 $\times 10^{-6}$ M)

and $D = 2 \times 10^{-3}$ IN (50.8 $\times 10^{-6}$ M)

if $$K_S = K_M + K_P \quad (2)$$

$$\delta_S = \frac{K_S + K_M + K_P}{K_S} \cdot D = 4 \times 10^{-3} \text{IN} \quad (3)$$
$$(101.6 \times 10^{-6} \text{M})$$

$$\delta_S = (d_{33} \cdot V_S) \cdot M \quad (4)$$

$$M = (4 \times 10^{-3} \text{ IN})/(40 \times 10^{-6} \text{ IN/KV} \cdot 1 \text{ KV}) = 100 \quad (5)$$

$$N = M/2 = 50 \quad (6)$$

$$X = M \cdot L = (100)(30 \times 10^{-3} \text{ IN}) = 3 \text{ IN (7.62 CM)} \quad (7)$$

$$K_S = \frac{Y \cdot A}{X} = \frac{\left(2 \times 10^6 \frac{\text{Lb}}{\text{IN}^2}\right)(0.5 \text{ IN}^2)}{3 \text{ IN}} = \quad (8)$$

$$333 \times 10^3 \frac{\text{Lb}}{\text{IN}} \left(583.4 \times 10^8 \frac{\text{dynes}}{\text{CM}}\right)$$

$$D_A = (4 \times 10^{-3} \text{IN}) \left(\frac{333}{603}\right) = 2.21 \times 10^{-3} \text{IN} \quad (9)$$
$$(56.1 \times 10^{-6} \text{M})$$

-continued $$\therefore D_A = \frac{2.21}{2.0} \cdot D = 1.105 \cdot D \quad (10)$$

I claim:

1. A linear actuator with piezoelectric displacement generator for linearly extending and retracting over a total range of extension along an extension axis thereof in response to voltage excitation signals presented from an external voltage signal source, comprising:

housing means for providing a compressive load along the extension axis of the displacement generator;

coupling means, disposed in said housing and responsive to the displacement generator for providing an output manifestation of the extension and retraction thereof;

as characterized by:

a displacement generator having discrete groups of piezoelectric material segments disposed coaxially in tandem along the extension axis, each group separately connected for response to bistable state voltage excitation signals presented individually thereto from the external voltage source in alternate extended state and quiescent state magnitudes, each group responding by alternately extending and retracting linearly along the extension axis in correspondence with said extended and quiescent state magnitudes, whereby the instant lineal sum of the extended and retracted states of all of said groups of segments define the instant actual extension of the actuator.

2. The actuator of claim 1, wherein the number of piezoelectric segments in each group are substantially equal to binary multiples of the number of segments in each other group, from a least significant bit (LSB) equivalent number to a most significant bit (MSB) equivalent number, the segments in each group being simultaneously responsive to said bistable state excitation signals applied to said group, whereby the actual extension of the actuator is provided in a binary progression.

3. The actuator of claim 1, wherein said groups are each connected for response to equal extended state and quiescent state magnitude voltage excitation signals and comprise equal number piezoelectric material segments for providing equal value extension increments, whereby the instantaneous actual extension value of the actuator is equal to the instantaneous lineal sum of the individual group extension increments as manifested by a present number of individual extended state magnitude excitation signals.

4. The actuator of claims 1, 2 or 3, wherein said quiescent state excitation signal magnitude is equal to zero VDC.

5. The actuator of claim 1, wherein said group piezoelectric material segments each comprise a pair of piezoelectric wafer elements, each wafer having parallel high potential and low potential surfaces defined in respect to the direction of polarization of the wafer, the wafers of each segment being coaxially disposed along the extension axis of said displacement generator with said high potential surfaces of each bonded to either side of a central high potential electrode and said low potential surfaces of each bonded to one side of a related one of two low potential electrodes associated therewith, the other side of each of said low potential electrodes being bonded to the low potential surfaces of an immediately preceding and an immediately succeeding segment in said group to provide a tandem cascade of oppositely polarized wafers interleaved with alternating high potential and low potential electrodes along the extension axis, said high potential and low potential electrodes each connected for response to the voltage excitation signals from the external source.

6. The actuator of claim 5, wherein said displacement generator demarcates each of said groups from among said tandem cascade of piezoelectric segments by a common electrical connection of the high potential electrodes of the segments associated with each group, which is electrically isolated from the common electrical connection of the high potential electrodes of each other group.

7. The actuator of claim 5, wherein said high potential electrode and said low potential electrodes of each segment comprise a conductive metal alloy bonded to the associated wafer surface with a conductive epoxy.

8. The actuator of claim 7, wherein said conductive metal alloy is berylium-copper.

9. The actuator of claim 5, wherein said piezoelectric material wafers comprise lead zirconate titanate.

10. The actuator of claim 5, wherein said piezoelectric material wafers comprise barium titanate.

* * * * *